United States Patent [19]

Weng

[11] Patent Number: 5,359,610
[45] Date of Patent: Oct. 25, 1994

[54] ERROR DETECTION ENCODING SYSTEM

[75] Inventor: Lih-Jyh Weng, Lexington, Mass.

[73] Assignee: Digital Equipment Corporation, Maynard, Mass.

[21] Appl. No.: 967,958

[22] Filed: Oct. 27, 1992

Related U.S. Application Data

[63] Continuation of Ser. No. 568,208, Aug. 16, 1990, abandoned.

[51] Int. Cl.$^5$ .............................. G06F 11/10
[52] U.S. Cl. .................... 371/38.1; 371/37.1
[58] Field of Search ................ 371/37.1, 38.1

[56] References Cited

U.S. PATENT DOCUMENTS

| | | | |
|---|---|---|---|
| 3,163,848 | 12/1964 | Abramson | 371/38.1 |
| 3,775,746 | 11/1973 | Boudreau et al. | 371/38.1 |
| 4,507,782 | 3/1985 | Kunimasa et al. | 371/37.1 |
| 4,569,050 | 2/1986 | Ohme | 371/37.1 |
| 4,979,173 | 12/1990 | Geldman et al. | |
| 5,062,111 | 10/1991 | Gotou et al. | 371/37.1 |
| 5,068,854 | 11/1991 | Chandran et al. | 371/37.1 |

FOREIGN PATENT DOCUMENTS

| | | |
|---|---|---|
| 0200124A3 | 4/1986 | European Pat. Off. |
| 071001A2 | 6/1990 | European Pat. Off. |
| 2048529 | 5/1979 | United Kingdom |
| 2232943 | 1/1990 | United Kingdom |

OTHER PUBLICATIONS

Clark, Jr. et al., Error–Correction Coding for Digital Communications, Plenum Press, ©1981.

Peterson et al., Error Correcting Codes, 2nd Edition, The MIT Press, © 1972.

*Primary Examiner*—Jerry Smith
*Assistant Examiner*—Emmanuel Moise
*Attorney, Agent, or Firm*—Cesari and McKenna

[57] ABSTRACT

An encoding system encodes up to 64 kilobytes of data using a binary Bose-Chaudhuri-Hocquenghem (BCH) error detection code. The code has as a generator polynomial g(x):

$$g(x)=(x^{20}+x^{17}+1)*(x+1)*(x^{20}+x^3+1)*(x^{20}+x^3+x^2+X+1)$$

which in octal representation is:
$g(x) = 4400001*3*4000011*4000017$ where * and + represent Galois Field multiplication and addition, respectively. The associated primitive polynomial is $x^{20}+x^{17}+1$. The encoder encodes the data using a code based on a polynomial f(x), which is g(x) multiplied by a factor, $b(x)=x^3+x+1$, or:

$$f(x)=(x^3+x+1)*(x^{20}+x^{17}+1)*(x+1)*(x^{20}+x^3+1)*(x^{20}+x^3+x^2+X+1)$$

which in octal representation is:
$f(x) = 13*4400001*3*4000011*4000017$

The inclusion of the factor in the code enhances the code's burst detecting capabilities. The code is capable of detecting 7 random errors, and a single burst error of up to 64 bits or double burst errors of up to 24 bits each.

28 Claims, 4 Drawing Sheets

ERROR DETECTION ENCODING SYSTEM

This application is a continuation of application Ser. No. 07/568,208 filed Aug. 16, 1990 and now abandoned.

BACKGROUND

The importance of error detection coding of data in data computer systems and data transmission systems, including computer networks, has increased greatly as data transmission rates have increased. Data is typically transmitted over a network in the form of multi-byte packets. As the transmission capabilities of the transmission systems increase, the size of the packets increases, allowing more data to be transmitted in a given period of time, In order to avoid problems with errors at the receiving end, error detection codes ("EDC's") are employed to, as the name implies, detect erroneous data.

Before a string of data symbols is transmitted, it is mathematically encoded to form EDC symbols. The EDC symbols are then appended to the data string to form a code word—data symbols plus EDC symbols—and the code word is transmitted as part of a packet. When the packet is received, the code word is mathematically decoded. During decoding any errors in the data are detected through manipulation of the EDC symbols [For a detailed description of decoding see Peterson and Weldon, *Error Correcting Codes*, 2d Edition, MIT Press, 1972].

Transmission errors occur as multiple independent, or random, errors and/or long bursts of errors. One of the most effective types of EDC used for the detection of multiple random errors is a Bose-Chaudhuri-Hocquenghem (BCH) error detection code [For a detailed description of BCH codes, see Peterson and Weldon, *Error Correcting Codes*]. To detect multiple random errors in strings of data symbols, BCH codes efficiently and effectively utilize the various mathematical properties of sets of symbols known as Galois Fields, represented "GF($P^q$)", where "P" is a prime number and "q" can be thought of as the number of digits, base P, in each element or symbol in the field. "P" usually has the value 2 in digital computer applications and, therefore, "q" is the number of bits in each symbol. For binary codes, q=1 and thus each symbol is a bit.

The number of bits which a binary BCH code can effectively encode and protect depends on the code length. The code length is determined by the associated primitive polynomial, where the primitive polynomial is a factor of the code. The higher the degree of the primitive polynomial, the longer the code and the more bits it can protect. If m is the degree of the primitive polynomial, the code length is $2^m-1$, and thus, the code can protect $2^m-1$ symbols minus "n", where "n" is the number of EDC symbols.

BCH codes are good for detecting random errors but are not particularly good for detecting burst errors. In order to enhance a BCH code's burst error detecting capability, the code may be modified by including in it another factor which is specifically selected for its burst detecting capabilities. This factor, also, increases the length of the code by r, where r is the period of the factor. Thus the length of the modified code is $r(2^m-1)$, if r is prime to $2^m$.

Known encoders do not currently use binary codes which are long enough to encode and protect the data in the larger packets. These encoders may encode a larger packet by manipulating a shorter binary code, for example, by interleaving the code a number of times. However, the encoding and decoding operations associated with such manipulations are complex and time consuming. Accordingly, they slow the data transmission rates.

What is needed is an encoder for encoding data in accordance with a binary code which is long enough to encode the larger data packets. Such an encoder can thus encode the packet data without interleaving or other manipulation of the code. Moreover, the code must have good error detection capabilities for both independent errors and long burst errors.

SUMMARY

The invention is an encoding system which encodes up to 64 kilobytes of data using a binary Bose-Chaudhuri-Hocquenghem (BCH) error detection code. The code has as a generator polynomial g(x):

$$g(x) = (x^{20} + x^{17} + 1)*(x+1)*(x^{20} + x^3 + 1)*(x^{20} + x^3 + x^2 + X + 1)$$

which in octal representation is:

g(x) = 4400001*3*4000011*4000017 where * and + represent Galois Field multiplication and addition, respectively. The associated primitive polynomial is $x^{20} + x^{17} + 1$.

In a preferred embodiment, the encoder uses a code based on a polynomial f(x), which is g(x) multiplied by a factor, $b(x) = x^3 + x + 1$, or:

$$f(x) = (x^3 + x + 1) * (x^{20} + x^{17} + 1) * (x + 1) *$$
$$(x^{20} + x^3 + 1) * (x^{20} + x^3 + x^2 + X + 1) = x^{64} + x^{63} +$$
$$x^{62} + x^{61} + x^{59} + x^{57} + x^{46} + x^{44} + x^{43} + x^{41} + x^{39} +$$
$$x^{38} + x^{30} + x^{28} + x^{27} + x^{20} + x^{18} + x^{17} + x^{10} + x^8 +$$
$$x^6 + x^5 + x + 1$$

which in octal representation is:

f(x) = 13*4400001*3*4000011*4000017

The inclusion of the factor in the code enhances the code's burst detecting capabilities.

The code is capable of detecting a single error burst of up to 64 bits, or double burst errors of up to 24 bits each. Moreover, the code, which has a guaranteed minimum distance of 8 and may have a much larger actual minimum distance, detects up to 7 independent errors, also. The preferred code generates 64 1-bit EDC symbols. The code based on the generator polynomial, g(x), without the factor b(x), generates 61 1-bit EDC symbols.

Alternatively, the encoder may encode the data using the reciprocal of f(x), that is, $f^*(x) = x^{64}*f(1/x)$, which in octal representation is:

f*(x) = 15*4000011*3*4400001*7400001.

Similarly the encoder may encode the data bits using a generator polynomial g*(x), which is the reciprocal of g(x), i.e., $x^{61}*g(1/x)$.

BRIEF DESCRIPTION OF THE DRAWINGS

For a more complete understanding of the features, advantages, and objects of the invention, reference should be made to the following detailed description and the accompanying drawings, in which.

DETAILED DESCRIPTION

It should be understood that all addition, and multiplication operations performed during the encoding and decoding processes are binary operations.

Figure 1:
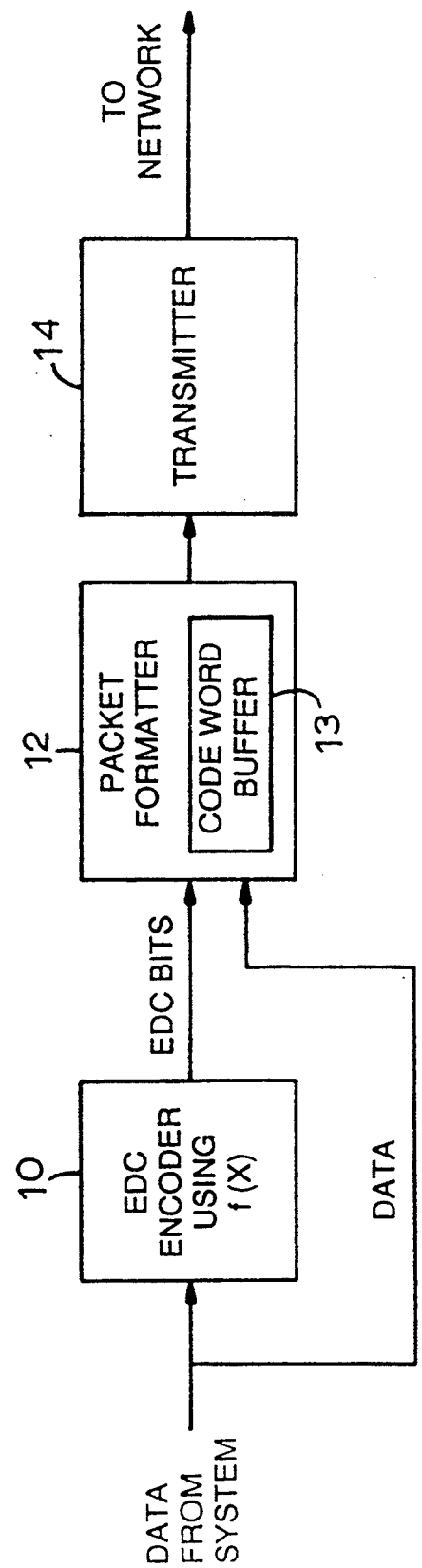
FIG. 1 is a functional block diagram of a system for transmitting data in the form of packets over a network.

FIG. 1 depicts a subsystem for transmitting a data packet over a network. The packets may contain up to 64 kilobytes of data, a number of EDC symbols, and other information such as source and destination indicators, data type indicators, and so forth, which relate to the network over which the data is being transmitted.

Before the data is transmitted, it is encoded by an EDC encoder 10 to generate EDC symbols. The encoder 10 encodes the data using a modified BCH code, or cyclic, code which is designed to detect both long burst errors and independent, or random, errors. It thus manipulates the data by, in effect, dividing the data by an associated polynomial, f(x), and generates 64 1-bit EDC symbols, as discussed in more detail below. If a particular data transmission system is not as susceptible to long bursts of errors, the encoder 10 may encode data by dividing it by g(x), as discussed below.

Once the data are encoded, the encoder 10 supplies to a packet formatter 12 the generated EDC symbols. The packet formatter 12 first concatenates the EDC symbols with the data to form a code word in a code word buffer 13. Next, the formatter includes the code word in a packet which contains information relating to the packet source, destination, data type, and so forth.

Once the packet is formed, the packet formatter 12 sends it to a transmitter 14. The transmitter 14 then prepares the packet for transmission by converting it to a form which is appropriate for the network, for example, by converting it to an NRZ signal, and sends it over the network.

The encoder 10 encodes the binary data using a BCH code associated with a generator polynomial, g(x):

$$g(x) = (x^{20} + x^{17} + 1)*(x+1)*(x^{20}+x^3+1)*(x^{20}+x^3+x^2+X+1)$$

or, in octal representation:

g(x)=4400001*3*4000011*4000017

This generator polynomial consists of several factors based on the primitive polynomial, $M_1(x)$, which is $x^{20}+x^3+1$ and has the primitive element, $\alpha^1$ as a root. The factors of g(x) are $M_{-1}(x)$, $M_0(x)$, $M_1(x)$, and $M_3(x)$, where $\alpha^i$ is a root of $M_i$. The natural code length of g(x) is $2^{20}-1$ or 1048575 bits.

The polynomial used in a preferred embodiment of encoder 10 contains another factor $b(x)=x^3+x+1$, which enhances the code's ability to detect burst errors. The code is thus based on the polynomial, f(x)=b(x)*g(x), or:

$$f(x) = (x^3 + x + 1) * (x^{20} + x^{17} + 1) * (x + 1) *$$
$$(x^{20} + x^3 + 1) * (x^{20} + x^3 + x^2 + X + 1) = x^{64} + x^{63} +$$
$$x^{62} + x^{61} + x^{59} + x^{57} + x^{46} + x^{44} + x^{43} + x^{41} + x^{39} +$$
$$x^{38} + x^{30} + x^{28} + x^{27} + x^{20} + x^{18} + x^{17} + x^{10} + x^8 +$$
$$x^6 + x^5 + x + 1$$

which, in octal representation, is:

f(x)=13*4400001*3*4000011*4000017

The factor b(x) enhances the double burst error detecting capabilities of the code, enabling it to detect longer bursts than a code based on just the generator polynomial, g(x). The natural length of this code, that is, the maximum number of symbols the code can protect, is $7*(2^{20}-1)$ symbols, which is 7340025 bits, minus the number of EDC symbols.

In a preferred embodiment the code is shortened to protect a maximum of 64 kilobytes of data. The shortened code detects a single burst error of up to 64 bits or double burst errors of up to 24 bits each. Further, the code can detect up to 7 independent errors based on its guaranteed minimum distance of 8. The actual minimum distance may be larger than 8, however, the actual distance has not been determined because of the large number of possible codewords. A shortened code based solely on g(x) can detect double bursts of up to 21 bits each, and thus, it may be used in situations where longer bursts are not anticipated.

Figure 2:
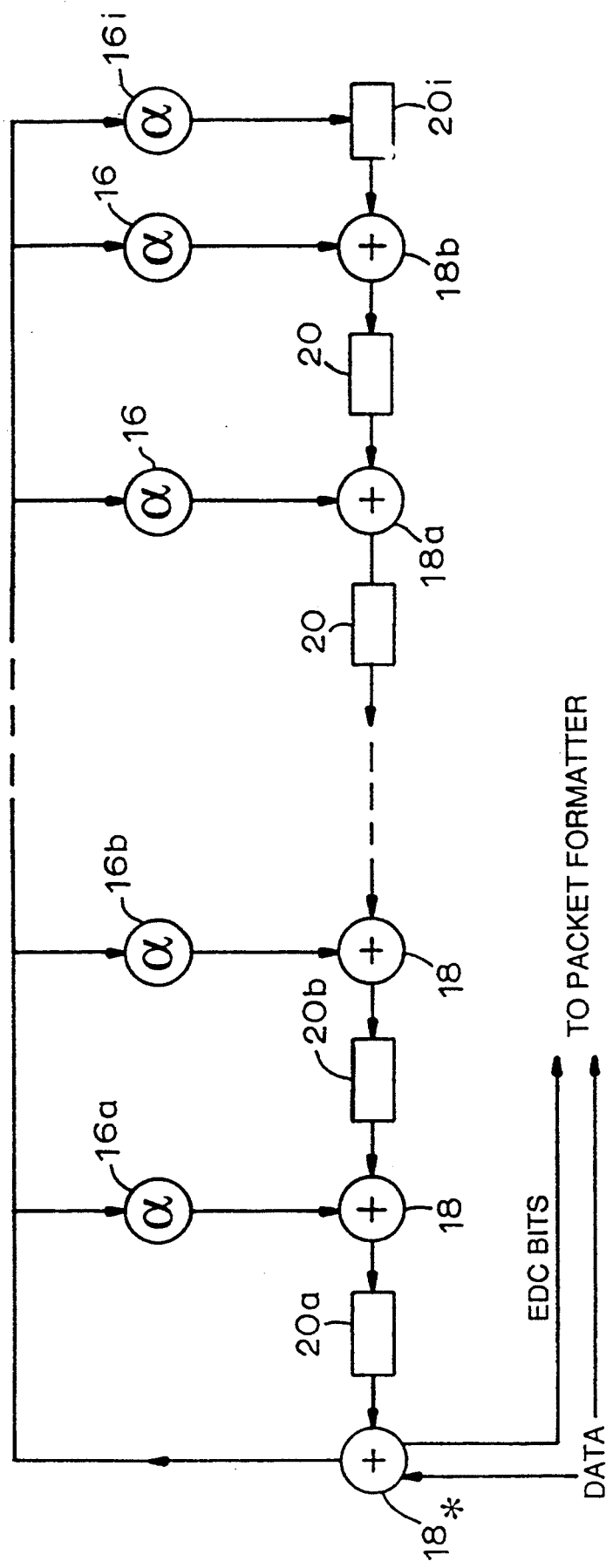
FIG. 2 is a diagram of an encoder used in the system of FIG. 1.
Figure 2A:
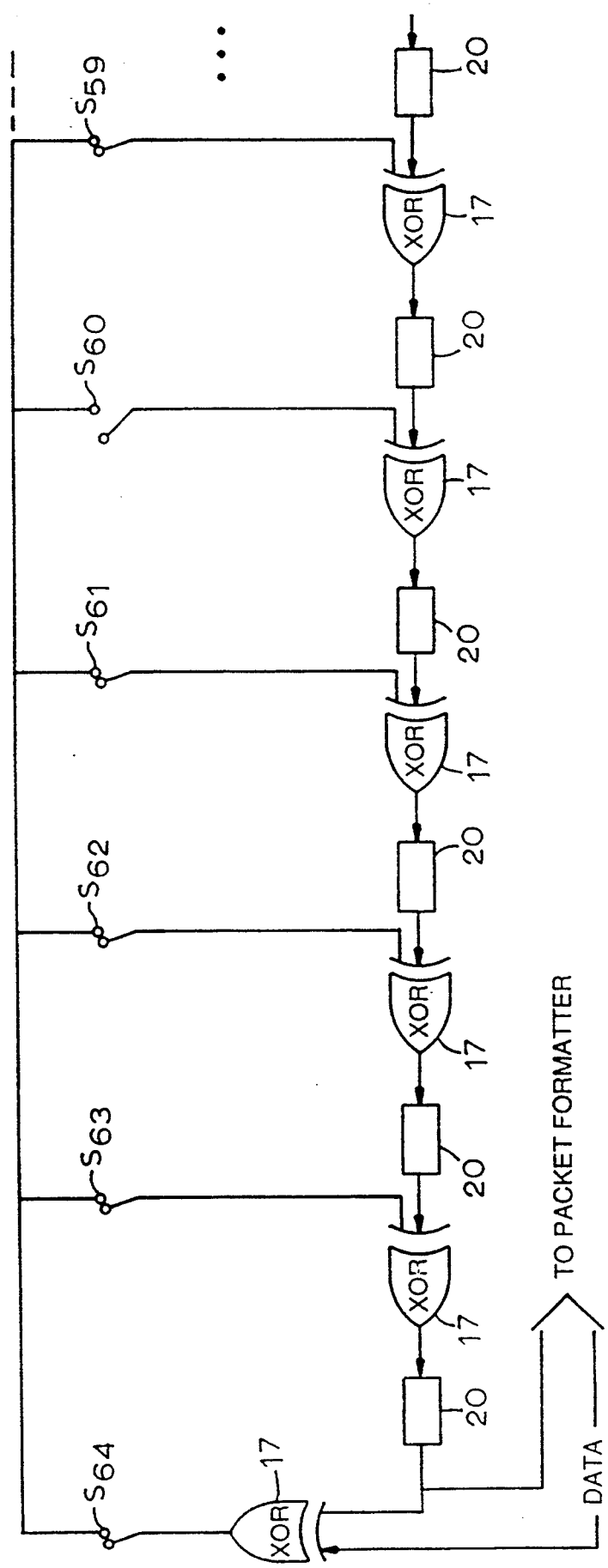
FIG. 2A is a diagram of the encoder of FIG. 2 constructed using switches and XOR gates.

FIG. 2 depicts encoder 10, which encodes data in accordance with a code associated with the polynomial f(x), as discussed above. The encoder includes binary multipliers 16—one for each of the 64 terms of the polynomial f(x)—with zero multipliers for the terms with coefficients of zero, binary adders 18 and shift registers 20. Binary multipliers can be thought of as switches, with a zero multiplier being a switch which is in the off position, and a one multiplier being a switch which is in the on position. Binary adders are also commonly referred to as XOR gates. FIG. 2A depicts the encoder 10 constructed with switches $S_i$ and XOR gates 17.

The encoder 10 encodes data applied to it by serially multiplying the data bits by the coefficients of the polynomial, f(x). Thus each data bit is applied in parallel to each of the Galois Field multipliers 16. The products are then applied to the adders 18, which add them to the products associated with earlier bits. The adders 18 apply the sums to the shift registers 20, which hold them until a next bit is multiplied by the coefficients and added to the previous product. As each data bit is applied to the encoder, it is added in adder 18*, to a sum associated with the encoding of the previous bits. The encoder continues its multiplying and adding operations until all the data bits are encoded.

After the data are encoded, the shift registers 20 contain the 64 1-bit EDC symbols. The shift registers are unloaded either in parallel or serially, as appropriate, to provide the EDC symbols to the packet formatter 12 (FIG. 1).

Figure 3:
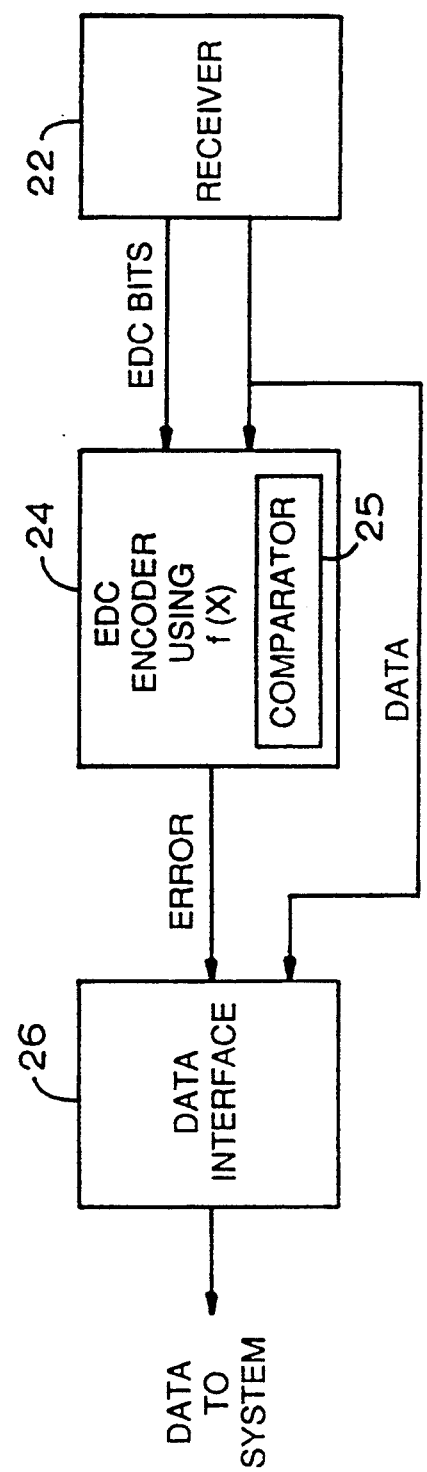
FIG. 3 is a functional block diagram of a system for receiving packets transmitted over a network.

The encoder 10 can also be used in a decoder, as depicted in the functional block diagram of FIG. 3. When a packet is received in a receiver 22, the receiver first demodulates the packet to decode it from, for example, an NRZ code, to digital bits. The data portion of the packet, that is, the data code word, is then sent to the decoder 24. The decoder 24 encodes the codeword data to generate EDC bits in the same manner as the encoder 10 described above with reference to FIG. 2. While the decoder 24 is decoding the data, a data interface 26 prepares them for transfer and/or begins transferring them to an appropriate system component.

After all the data are encoded, the decoder compares the generated EDC bits with the code word EDC bits in a comparator 25. If the two sets of EDC bits do not match, the data contains errors. The decoder 24 thus sends an asserted error signal to the data interface 26. In response to the asserted error signal, the data interface 26 either stops its data transfer operation, or sends along with the data an error message, as appropriate. The data interface 26 may then request that the packet source re-send the packet. In the preferred embodiment, the data interface 26 does not perform any error correction operations because such operations may prevent it from receiving the next transmitted packet, and thus, slow the system data transfer rate.

If the generated EDC bits match the received EDC bits, the decoder 24 treats the data as error-free. Accordingly, the decoder 24 refrains from asserting the error signal, and the data interface 26 continues its data transfer operation.

The encoder 10 or decoder 24 may be constructed using hardware, firmware or software. Further, known mechanisms for decreasing the hardware required or speeding the encoding operation may be incorporated in the encoder or decoder without affecting the random and burst error detecting capabilities of the code. Accordingly, it is the object of the appended claims to cover all variations and modifications as come within the true spirit and scope of the invention.

What is claimed as new and desired to be secured by Letters Patent of the United States is:

1. A system for encoding up to 64 kilobytes of data, the system comprising:

A. a divider with feedback connections to divide the data bits by a binary polynomial, f(x), where f(x) is:

$$f(x)=(x^3+x+1)*(x^{20}+x^{17}+1)*(x+1)*(x^{20}+x^3+1)*(x^{20}+x^3+x^2+X+1)$$

which, in octal representation, is:
   f(x)=13*4400001*3*4000011*4000017,
   the divider retaining as error detection bits a multi-bit remainder; and B. means for concatenating the error detection bits with the data to form a code word.

2. The system of claim 1, wherein the divider includes:

a. multiplying means for multiplying each data bit, in parallel, by binary representations of coefficients of the binary polynomial f(x), b. combining means for combining (i) products produced by the multiplying means and (ii) combinations associated with previously encoded data bits to produce combinations associated with the data bit being encoded, and c. means for retrieving as the error detection bits the combinations associated with the encoding of a last data bit.

3. A system for transmitting data over a network in the form of multi-byte packets, the system including:

A. a divider with feedback connections to divide the data bits by a binary polynomial, f(x), where f(x) is:

$$f(x)=(x^3+x+1)*(x^{20}+x^{17}+1)*(x+1)*(x^{20}+x^3+1)*(x^{20}+x^3+x^2+X+1)$$

which, in octal representation, is:
   f(x)=13*4400001*3*4000011*4000017
   the divider retaining as error detection bits a multi-bit remainder;

B. means for concatenating the error detection bits with the data to form a code word;

C. packet forming means for receiving the code word and including the code word in a packet, the packet forming means including in the packet information necessary to direct the packet over the network to a predetermined destination; and D. transmitting means for transmitting the packet over the network.

4. The system of claim 3, wherein the system further includes:

A. means for receiving a packet;

B. decoding means for decoding said data code word in said received packet, said decoding means including
      i. manipulating means for manipulating the data portion of said code word to generate error detection bits, said manipulating means dividing the data by said binary polynomial f(x),
      ii. means for comparing said generated error detection bits with the error detection bits in said code word,
      iii. means for asserting an error signal to indicate errors in the code word if said comparison means detects a difference between said generated error detection bits and the error detection bits in said code word, and c. data transfer means for transferring the data to a predetermined destination, said data transfer means transferring an error message with the data if said error signal is asserted.

5. The system of claim 3, wherein the system further includes:

A. means for receiving a packet;

B. decoding means for decoding said data code word in said received packet, said decoding means including
      i. manipulating means for manipulating the data portion of said code word to generate error detection bits, said manipulating means dividing the data by said binary polynomial f(x),
      ii. means for comparing said generated error detection bits with the error detection bits in said code word,
      iii. means for asserting an error signal to indicate errors in the code word if said comparison means detects a difference between said generated error detection bits and the error detection bits in said code word, and C. data transfer means for transferring the data to a predetermined destination, said data transfer means aborting a data transfer if said error signal is asserted.

6. The system of claim 3, wherein the divider includes:

a. multiplying means for multiplying each data bit, in parallel, by binary representations of coefficients of the binary polynomial f(x), b. combining means for combining (i) products produced by the multiplying means and (ii) combinations associated with previously encoded data bits to produce combinations associated with the data bit being encoded, and c. means for retrieving as the error detection bits the combinations associated with the encoding of a last data bit.

7. The system of claim 6, wherein:
a. the multiplying means is a plurality of binary multipliers, and
b. the combining means is a plurality of binary adders.

8. The system of claim 6, wherein:
a. the multiplying means is a plurality of switches,
b. the combining means is a plurality of exclusive-OR gates.

9. A decoding system for decoding errors in data code words which contain data and error detection symbols, said symbols being generated by encoding the data in accordance with a binary polynomial f(x):

$$f(x)=(x^3+x+1)*(x^{20}+x^{17}+1)*(x+1)*(x^{20}+x^3+1)*(x^{20}+x^3+x^2+X+1)$$

which, in octal representation, is:
f(x)=13*4400001*3*4000011*4000017
said system including:
A. a divider with feedback connections to divide the data by said polynomial f(x) the divider retaining as error detection bits a multi-bit remainder;
B. comparison means for comparing said generated error detection bits with the error detection bits in said code word; and
C. means for detecting errors and asserting an error signal to indicate errors in the code word if said comparison means detects a difference between said generated error detection bits and said error detection bits in said code word.

10. The decoder of claim 9, wherein the divider includes:
i. multiplying means for multiplying each data bit, in parallel, by binary representations of coefficients of the binary polynomial f(x),
ii. combining means for combining (a) products produced by the multiplying means and combinations associated with previously encoded data bits, and
iii. means for retrieving as the error detection bits the combinations associated with the encoding of a last data bit.

11. The system of claim 10, wherein:
a. the multiplying means is a plurality of binary multipliers, and
b. the combining means is a plurality of binary adders.

12. The system of claim 10, wherein:
a. the multiplying means is a plurality of switches, and
b. the combining means is a plurality of exclusive-OR gates.

13. A system for encoding up to 64 kilobytes of data, the system comprising:
A. encoding means for generating error detection bits by dividing the data by a binary polynomial, f(x), where (fx) is:

$$f(x)=(x^3+x+1)*(x^{20}+x^{17}+1)*(x+1)*(x^{20}+x^3+1)*(x^{20}+x^3+x^2+X+1)$$

which, in octal representation, is:
f(x)=13*4400001*3*4000011*4000017, the encoding means including:
i. a plurality of switches, with each switch corresponding to a term of the binary polynomial f(x), a switch being in the open position for a term with a coefficient of zero and in the closed position for a term with a coefficient of one the switches interrupting or passing, respectively, signals associated with the encoding of a data bit,
ii. a plurality of gates for combining to produce combinations associated with the encoding of the data bit (a) signals from the switches and (b) combinations associated with previously encoded data bits, and
iii. means for retrieving as the error detection bits the combinations associated with the encoding of a last data bit; and
B. means for concatenating the error detection bits with the data to form a code word.

14. A system for encoding up to 64 kilobytes of data, the system comprising:
A. encoding means for generating error detection bits by dividing the data by a binary polynomial, f(x), where f(x) is:

$$f(x)=(x^3+x+1)*(x^{20}+x^{17}+1)*(x+1)*(x^{20}+x^3+1)*(x^{20}+x^3+x^2+X+1)$$

which, in octal representation, is:
f(x)=13*4400001*3*4000011*4000017, the encoding means including:
i. a plurality of binary multipliers, for multiplying each data bit by binary representations of coefficients of the binary polynomial f(x),
ii. a plurality of binary adders for adding products produced by the multipliers to sums associated with previously encoded data bits, and
iii. means for retrieving as the error detection bits the sums associated with the encoding of a last data bit; and
B. means for concatenating the error detection bits with the data to form a code word.

15. A system for transmitting data over a network, the system including:
A. encoding means for generating error detection bits by dividing the data by a binary polynomial, f(x), where f(x) is:

$$f(x)=(x^3+x+1)*(x^{20}+x^{17}+1)*(x+1)*(x^{20}+x^3+1)*(x^{20}+x^3+x^2+X+1)$$

which, in octal representation, is:
f(x)=13*4400001*3*4000011*4000017;
B. means for concatenating the error detection bits with the data to form a code word;
C. transmitting means for transmitting the code word over the network;
D. means for receiving a code word;
E. decoding means for decoding said code word, said decoding means including
i. manipulating means for manipulating the data portion of said code word to generate error detection bits, said manipulating means dividing the data by said binary polynomial f(x) and retaining as the error detection bits a multi-bit remainder,
ii. means for comparing said error detection bits with the error detection bits in said code word,
iii. means for asserting an error signal to indicate errors in the code word if said comparison means detects a difference between said generated error detection bits and the error detection bits in said code word, and
F. data transfer means for altering the data by including therein an error message and transferring the altered data to a predetermined destination, if said error signal is asserted, and if said error signal is not asserted transferring the data without alteration to the predetermined destination.

16. The system of claim 15, wherein the encoding means includes:
    a. multiplying means for multiplying each data bit, in parallel, by binary representations of coefficients of the binary polynomial f(x),
    b. combining means for combining (i) products produced by the multipliers and (ii) combinations associated with previously encoded data bits to produce combinations associated with the data bit being encoded, and
    c. means for retrieving as the error detection bits the combinations associated with the encoding of a last data bit.

17. The system of claim 15, wherein the encoding means includes:
    a. a plurality of binary multipliers, for multiplying each data bit by binary representations of coefficients of the binary polynomial f(x),
    b. a plurality of binary adders for adding products produced by the multipliers to sums associated with previously encoded data bits to produce sums associated with the data bit being encoded, and
    c. means for retrieving as the error detection bits sums associated with the encoding of a last data bit.

18. The system of claim 15, wherein the encoding means includes:
    a. a plurality of switches, with each switch corresponding to a term of the binary polynomial f(x), a switch being in the open position for a term with a coefficient of zero and in the closed position for a term with a coefficient of one, the switches interrupting or passing, respectively, signals associated with a data bit being encoded;
    b. a plurality of gates for combining, to produce combinations associated with a data bit being encoded, (i) signals from the switches and (ii) combinations associated with previously encoded data bits; and
    c. means for retrieving as the error detection bits the combinations associated with the encoding of last data bit.

19. A system for transmitting data bits over a network, the system including:
    A. encoding means for generating error detection bits by dividing the data by a binary polynomial, f(x), where f(x) is:

$$f(x)=(x^3+x+1)*(x^{20}x^{17}+1)*(x+1)*(x^{20}x^3+1)*(x^{20}+x^3+x^2+X+1)$$

which, in octal representation, is:
    f(x)=13*4400001*3*4000011*4000017;
    B. means for concatenating the error detection bits with the data to form a code word;
    C. transmitting means for transmitting the code word over the network;
    D. means for receiving a code word;
    E. decoding means for decoding said code word, said decoding means including
       i. manipulating means for manipulating the data portion of said code word to generate error detection bits, said manipulating means dividing the data by said binary polynomial f(x),
       ii. means for comparing said generated error detection bits with the error detection bits in said code word,
       iii. means for asserting an error signal to indicate errors in the code word if said comparison means detects a difference between said generated error detection bits and the error detection bits in said code word, and
    F. data transfer means for transferring the data to a predetermined destination, said data transfer means altering the data transferred by transferring fewer than all the data bits, if said error signal is asserted.

20. The system of claim 19, wherein the encoding means includes:
    a. multiplying means for multiplying each data bit, in parallel, by binary representations of coefficients of the binary polynomial f(x),
    b. combining means for combining (i) products produced by the multiplying means and (ii) combinations associated with previously encoded data bits to produce combinations associated with the data bit being encoded, and
    c. means for retrieving as the error detection bits the combinations associated with the encoding of a last data bit.

21. The system of claim 19, wherein the encoding means includes:
    a. a plurality of binary multipliers, for multiplying each data bit by binary representations of coefficients of the binary polynomial f(x),
    b. a plurality of binary adders for adding products produced by the multipliers to sums associated with previously encoded data bits to produce sums associated with the data bit being encoded, and
    c. means for retrieving as the error detection bits the sums associated with the encoding of a last data bit.

22. The system of claim 19, wherein the encoding means includes:
    a. a plurality of switches, with each switch corresponding to a term of the binary polynomial f(x), a switch being in the open position for a term with a coefficient of zero and in the closed position for a term with a coefficient of one, the switches interrupting or passing, respectively, signals associated with a data bit being encoded;
    b. a plurality of gates for combining to produce combinations associated with a data bit being encoded (i) signals from the switches and (iii) combinations associated with previously encoded data bits; and
    c. means for retrieving the as the error detection bits the combinations associated with the encoding of a last data bit.

23. A method for producing signals representing code words, the code words containing multiple binary data bits and multiple error detection bits, the method including the steps of:
    A. dividing the data bits by a binary polynomial, f(x), where f(x) is:

$$f(x)=(x^3+x+1)*(x^{20}+x^{17}+1)*(x+1)*(x^{20}+x^3+1)*(x^{20}+x^3+x^2+X+1)$$

which, in octal representation, is:
    f(x)=13*4400001*3*4000011*4000017,
    B. retaining as error detection bits a multi-bit remainder produced in step A; and
    C. concatenating the error detection bits with the data to form a code word.

24. The method of claim 23, wherein the dividing step includes:

a. multiplying each data bit, in parallel, by binary representations of coefficients of the binary polynomial f(x);

b. combining (i) products produced by step a. and (ii) combinations associated with previously encoded data bits to produce combinations associated with the data bit being encoded; and c. retrieving as the error detection bits the combinations associated with the encoding of a last data bit.

25. A method for protecting signals representing binary data bits from errors, the method including the steps of:

A. dividing the data bits by a binary polynomial, f(x), where f(x) is:

$$f(x)=(x^3+x+1)*(x^{20}+x^{17}+1)*(x+1)*(x^{20}+x^3+1)*(x^{20}+x^3+x^2+X+1)$$

which, in octal representation, is:
f(x)=13*4400001*3*4000011*4000017,

B. retaining as error detection bits a multi-bit remainder produced in step A;

C. concatenating the error detection bits with the data to form a code word;

D. transmitting the code word;

E. receiving a code word;

F. decoding the code word by
  i. dividing the code word data by the binary polynomial f(x);
  ii. retaining as error detection bits a multi-bit remainder;
  iii. comparing said error detection bits with the error detection bits in the code word;
  iv. asserting an error signal to indicate errors in the code word if the error detection bits generated during decoding and the error detection bits in the code word differ; and G. altering the data by including therein an error message and transferring the altered data to a predetermined destination, if the error signal is asserted, and if the error signal is not asserted transferring the data without alteration.

26. The method of claim 25, wherein the dividing step includes:

a. multiplying each data bit, in parallel, by binary representations of coefficients of the binary polynomial f(x);

b. combining (i) products produced by step a. and (ii) combinations associated with previously encoded data bits to produce combinations associated with the data bit being encoded; and c. retrieving as the error detection bits the combinations associated with the encoding of a last data bit.

27. A method for protecting signals representing binary data bits from errors, the method including the steps of:

A. dividing the data bits by a binary polynomial, f(x), where f(x) is:

$$f(x)=9x^3+x+1)*(x^{20}+x^{17}+1)*(x+1)*(x^{20}+x^3+1)*(x^{20}+x^3+x^2+X+1)$$

which, in octal representation, is:
f(x)=13*4400001*3*4000011*4000017,

B. retaining as error detection bits a multi-bit remainder produced in step A;

C. concatenating the error detection bits with the data to form a code word;

D. transmitting the code word;

E. receiving a code word;

F. decoding the code word by
  i. dividing the code word data by the binary polynomial f(x);
  ii. retaining as error detection bits a multi-bit remainder;
  iii. comparing said error detection bits with the error detection bits in the code word;
  iv. asserting an error signal to indicate errors in the code word if the error detection bits generated during decoding and the error detection bits in the code word differ;

G. discarding one or more of the code word data bits and transferring the data bits which have not been discarded, if the error signal is asserted; and H. transferring all the code word data bits, if the error signal is not asserted.

28. The method of claim 27, wherein the dividing step includes:

a. multiplying each data bit, in parallel, by binary representations of coefficients of the binary polynomial f(x);

b. combining (i) products produced by step a. and (ii) combinations associated with previously encoded data bits to produce combinations associated with the data bit being encoded; and c. retrieving as the error detection bits the combinations associated with the encoding of a last data bit.

* * * * *